(12) United States Patent
Dow

(10) Patent No.: US 6,806,767 B2
(45) Date of Patent: Oct. 19, 2004

(54) POWER AMPLIFIER WITH LOAD SWITCHING CIRCUIT

(75) Inventor: Gee Samuel Dow, Westlake Village, CA (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 10/190,567

(22) Filed: Jul. 9, 2002

(65) Prior Publication Data

US 2004/0008082 A1 Jan. 15, 2004

(51) Int. Cl.[7] ................................................ H03F 1/14
(52) U.S. Cl. ........................ 330/51; 330/129; 330/302; 330/306
(58) Field of Search ........................ 330/51, 129, 133, 330/285, 302, 303, 305, 306

(56) References Cited

U.S. PATENT DOCUMENTS

| | | | |
|---|---|---|---|
| 3,169,229 A | 2/1965 | Ulzurrun | 330/24 |
| 3,331,028 A | 7/1967 | Bay et al. | 330/24 |
| 3,391,347 A | 7/1968 | Bosse et al. | 330/31 |
| 3,497,823 A | 2/1970 | Kriss et al. | 330/29 |
| 3,539,826 A | 11/1970 | Crouse | 307/229 |
| 4,438,408 A | 3/1984 | Skrovanek et al. | 330/284 |
| 4,731,869 A | 3/1988 | Farrer | 455/127 |
| 5,029,298 A * | 7/1991 | Chiba et al. | 330/285 |
| 5,051,706 A * | 9/1991 | Zushi | 330/306 |
| 5,060,294 A | 10/1991 | Schwent et al. | 455/93 |
| 5,086,508 A | 2/1992 | Furuno | 455/69 |
| 5,101,507 A | 3/1992 | Jung | 455/127 |
| 5,276,912 A | 1/1994 | Siwiak et al. | 455/73 |
| 5,432,473 A | 7/1995 | Mattila et al. | 330/133 |
| 5,548,248 A | 8/1996 | Wang | 330/288 |
| 5,774,017 A | 6/1998 | Adar | 330/51 |
| 5,789,984 A | 8/1998 | Davis et al. | 330/279 |
| 5,880,635 A | 3/1999 | Satoh | 330/144 |
| 5,903,193 A | 5/1999 | Adachi | 330/279 |
| 5,909,643 A | 6/1999 | Aihara | 455/127 |
| 5,914,641 A * | 6/1999 | Yun et al. | 330/302 |
| 5,990,747 A | 11/1999 | Chaki et al. | 330/286 |
| 6,020,787 A | 2/2000 | Kim et al. | 330/279 |
| 6,118,989 A * | 9/2000 | Abe et al. | 330/51 |
| 6,127,886 A | 10/2000 | Khabbaz et al. | 330/51 |
| 6,130,589 A | 10/2000 | Yamaguchi et al. | 333/32 |
| 6,188,877 B1 | 2/2001 | Boesch et al. | 455/74 |
| 6,195,536 B1 | 2/2001 | Peckham et al. | 455/127 |
| 6,198,347 B1 | 3/2001 | Sander et al. | 330/251 |
| 6,215,359 B1 | 4/2001 | Peckham et al. | 330/302 |
| 6,240,279 B1 | 5/2001 | Nitta et al. | 455/127 |
| 6,243,566 B1 | 6/2001 | Peckham et al. | 455/127 |

* cited by examiner

*Primary Examiner*—Long Nguyen
(74) *Attorney, Agent, or Firm*—Morgan, Lewis & Bockius, LLP

(57) ABSTRACT

A power amplifier circuit includes a power amplifier responsive to a power mode signal, the power amplifier having a power amplifier output node, and a power amplifier load circuit also responsive to the power mode signal, the power amplifier load circuit having a load circuit input node connected to the power amplifier output node. The power amplifier load circuit has a first transmission line coupled between the load circuit input node and a first node, a harmonic filter coupled between the load circuit input node and a common node, a first capacitor coupled between the first node and the common node, and a first switch coupled between the common node and ground, where the first switch is responsive to the power mode signal.

19 Claims, 10 Drawing Sheets

POWER AMPLIFIER WITH LOAD SWITCHING CIRCUIT

FIELD OF THE INVENTION

The present invention relates generally to the field of power amplifiers in multi-band communication systems. More particularly, the present invention relates to circuitry associated with such power amplifiers, such as harmonic filters, impedance load switching circuits, pre-distortion phase filters, and the like.

BACKGROUND OF INVENTION

In the United States, cellular operating licenses have been awarded by the Federal Communication Commission (FCC) pursuant to a licensing scheme which divides the country into geographic service markets. Cellular licenses were originally granted for radio frequency (RF) blocks in the 800 MHz range. Most 800 MHz cellular telephone systems in the United States utilize the Advanced Mobile Phone Service (AMPS) analog air interface standard. A later generation air interface standard for the 800 MHz band, known as D-AMPS, has subsequently been developed and implemented. The D-AMPS standard comprises both digital and analog cellular communication. Thus, there are presently both analog (AMPS) and digital (D-AMPS) cellular telephone networks in operation at 800 MHz in the United States.

In response to increased demand for cellular services, a number of digital air interface standards were developed for providing efficient digital communication of voice, data, fax and text messages under the umbrella of "personal communications services" or PCS. Operational PCS systems, such as systems based on the GSM TDMA (Time Division Multiple Access) or IS-95 CDMA (Code Division Multiplex Access) air interface standards, are being implemented in the United States in the 1900 MHz frequency range. Meanwhile, existing 800 MHz cellular systems continue to operate. Thus, there are presently operating in the United States analog and digital cellular systems at 800 MHz and digital PCS systems at 1900 MHz. Mobile subscribers who desire to receive services from systems operating at 800 MHz and from systems operating at 1900 MHz must either use two different mobile transceivers or use a single "dual-band" mobile transceiver which can receive and transmit radio frequency (RF) signals in both frequency bands.

Power control is essential to the smooth operation of CDMA communication systems. Since there are many users sharing the frequency spectrum, in order to resolve the near-far multiple-access in a spread-spectrum system, output power for each individual user needs to be adjusted dynamically to maximize the system capacity. For this reason, a typical CDMA handset is operated under a varied output condition. According to actual statistics obtained from the field, a CDMA cellular phone handset spent approximately 95% of its time transmitting output power in a range of 10–30 dB lower than its maximum rated output power. Recognizing this fact, most CDMA handset power amplifiers have lower power (LP) and high power (HP) modes of operation. The purpose of this two-mode operation is to improve the efficiency performance at the LP mode.

FIG. 1 shows a diagram of a typical wireless voice communication device 100, such as a mobile phone handset 100 for cellular telephone use. For the voice interface, device 100 includes a microphone 102 for converting audio signals to electrical signals which the transmitter 104 can then send. Device 100 also includes a receiver 112 connected to a speaker 114. The transmitter 104 and the receiver 112 normally share an antenna 110, although separate antennas may instead be provided.

The transmitter 104 includes, inter alia, a speech coder 120 for encoding the electrical voice signals and forwards them to a modulator 122. Depending on the power mode and network used, the modulator 122 mixes the coded signals to the appropriate frequency band. For example, modulator 122 shifts the signal to approximately 800 MHz in the case of CDMA or 1900 MHz in the case of Wideband CDMA (WCDMA). Power amplifier/load switch 124 amplifies and impedance matches the signal. The load switch portion of the power amplifier/load switch 124 matches the outgoing signal to the required impedance and may also filter out various signal harmonics. Matching impedances helps an amplifier maximize power efficiency and filtering harmonics reduces interference. An isolator 106 and a receive/transmit duplexer 108 connect the power amplifier/load switch circuit 124 and antenna 110. Using this series of components the handset 100 may transmit RF signals using the antenna 110.

The receiver 112 obtains a received RF signal from the antenna 110 via the duplexer 108. An RF receiver 130 prepares the received RF signal for demodulation. A demodulator 132 demodulates the received RF signal to output a demodulated signal, and a speech decoder 134 decodes the demodulated signal to form an audio signal for reproduction on speaker 114.

Considerable power in a wireless communication device is dissipated in the power amplifier (PA) (e.g., power amplifier/load switch 124) and the efficiency of a power amplifier is predominately determined by its output load design. There are two main factors affecting the output load design: 1. class of operation (e.g., class -A, -A/B, -B, -C, -E, etc.); and 2. load impedance at the fundamental and harmonic frequencies. In a typical PA design, the load is designed to achieve the best efficiency performance at its highest output power. For those power amplifiers that need to have low signal distortion (such as CDMA PA), there are the additional linearity requirements that need to be satisfied.

Wireless communication devices typically transmit RF signals at a plurality of power levels. However, the efficiency of the PA significantly varies over the output power range. Because current drain efficiency of the PA is most affected at a higher output power, the PA is designed to maximize efficiency at higher output power levels. One technique to improve power efficiency requires switching the quiescent current of the PA in response to a PA output high power (HP)/low power (LP) mode control change. At the HP mode, the PA is biased with high quiescent current in order to maximize its output current swing; at the LP mode, the PA is biased with low quiescent current in order to reduce current consumption. Another circuit technique that could be considered to improve the efficiency for varied output power system is by load switching—i.e., the output load is adjusted in accordance to the output power requirements.

Operational efficiency of a power amplifier is dependent on load impedance. A PA is generally designed for maximum output power operation. This usually means the output device "sees" a low impedance load. This is necessary to maximize the device's current swing. However, this low impedance unavoidably leads to a degraded efficiency when the output power level is lowered. In order to achieve improved efficiency performance at lower output power, the output device needs to "see" a high impedance load. A switched load circuit is a circuit implementation which provides a two-state (or multi-state) load design—i.e., a low impedance state for high power operation and a high impedance state for low power operation. Hence, the load is adjusted via a "switching" operation.

The trend of cellular wireless communication is moving toward a multi-mode handset. To simplify the implementation of a multi-mode handset, it is desirable to have components that can operate in multiple frequency bands. This is usually not too difficult a task for many RF components; however, a multi-mode PA is hard to realize because of the narrow band nature of the PA and to its low output load impedance. One method to overcome this problem is to use a switched load technique that can switch the load to the designated impedance in accordance with the selected frequency band.

U.S. Pat. No. 5,774,017 (issued to Adar) (henceforth referred to as the '017 patent), teaches a multiple-band amplifier. More particularly, it discloses a GaAs MMIC dual-band amplifier for wireless communications for operation at either the 800 MHz or the 1900 MHz band and it provides desired gain and input and output impedance. Switching impedance networks are used at the input and output of the amplifier to provide matching input impedance and desired output impedance for operation in the two bands. Switching impedance networks are also used between any successive stages of the amplifier to provide proper interstage impedance. The dual band amplifier includes a bias control circuit which biases the amplifier to operate in A, B, AB, or C mode. The amplifier can be used for the AMPS 800 or the GSM 900 operation or any other cellular operation such as the PCS 1900 and it can be switched between the two operations by simply applying a proper control signal to the amplifier.

U.S. Pat. No. 6,188,877 (issued to Boesch et al.) (henceforth referred to as the '877 patent) describes a dual-band, dual-mode power amplifier with reduced power loss. More particularly, it discloses a power amplifier circuit having a driver amplifier stage including a low band driver amplifier and a high band driver amplifier. A final amplifier stage includes a linear mode amplifier for amplifying digitally modulated signals and a saturated (nonlinear) mode amplifier for amplifying frequency modulated (analog) signals. A switching network interconnects the driver amplifier stage and the final amplifier stage. Depending on the desired mode of operation, an appropriate driver amplifier can be coupled to an appropriate final amplifier to most effectively and efficiently amplify analog or digital RF signals in either of a plurality of frequency bands. A matching circuit is coupled to the linear mode final amplifier for impedance matching and for separating D-AMPS (800 MHz band) and PCS (1900 MHz band) digital signals. A power impedance matching circuit is coupled to the output of the saturated mode final amplifier. In one embodiment, an isolator is coupled to the output of one or more of the low band or high band outputs of the duplex matching circuit. In the low band analog path, a duplexer is provided ahead of the coupling means for reducing the RF power requirements on the coupling means. The switching network and input filter stage may precede a driver amplifier stage.

U.S. Pat. No. 6,215,359 (issued to Peckham et al.) (henceforth referred to as the '359 patent) teaches an impedance matching for a dual band power amplifier. It describes using a switched capacitor circuit to accomplish GSM/DCS dual band load impedance switching and harmonic suppression high level. More particularly, the '359 patent discloses an exciter matching circuit, interstage matching circuit, and harmonic filter matching circuit match impedances at the input to a two-stage PA, between the first stage and the second stage of the PA, and at the output of the PA for more than one frequency band of interest. In a GSM/DCS dual band radiotelephone, the matching circuits provide low return loss at 900 MHz when the dual band transmitter is operating in the GSM mode. The harmonic filter matching circuit also filters out signals at 1800 MHz, 2700 MHz, and high order harmonics. When the dual band transmitter is in DCS mode, however, the matching circuits provide a low return loss at 1800 MHz and filter out signals at 2700 MHz and harmonics of 1800 MHz.

FIG. 2 shows a prior art load circuit 200 that operates in conjunction with a power amplifier 202. The load circuit of FIG. 2 is not unlike that disclosed in U.S. Pat. No. 6,243,566 to Peckham et al. For simplicity, only the circuit 200 is shown in detail, it being understood that more than one type of amplifier may work with circuit 200.

The circuit 200 includes a signal input node N21 which receives the output from the power amplifier 202. A first transmission line TL21 is connected between node N21 and a second node N22 which is internal to the circuit 200. A second transmission line TL22 is connected between the second node N22 and a third node N23. A first capacitor C21 is connected between second node N22 and ground and a second capacitor C22 is connected between third node N23 and an fourth node N24 which may be an input to the next element or circuit, such as an isolator, in the overall device. Capacitor C22 acts as a DC blocking capacitor, allowing RF signals to pass therethrough.

Load circuit 200 represents an output matching circuit whose impedance is determined by the characteristics of the transmission lines and the capacitance of the capacitor C21. If the power amplifier 202 is configured to operate in HP mode, then the value of capacitor C21 is chosen to lower the impedance seen by the power amplifier 202. For LP mode capacitor C21 is chosen so that the power amplifier 202 sees a higher impedance. Since the value of capacitor C21 determines the impedance seen by the power amplifier 202, it indirectly determines the power efficiency of the power amplifier 202. Typically, manufacturers configure the value of capacitor C21 to operate in HP mode so that phone performance may deal with interference more effectively. Although phone performance may be improved in this configuration, the average power efficiency is reduced and thus battery life suffers.

FIG. 3 shows a prior art load switching circuit 300 that operates in conjunction with a power amplifier 302. Again, for simplicity, only the circuit 300 is shown in detail, it being understood that more than one type of amplifier may work with circuit 300.

The circuit 300 includes a signal input node N31 which receives the output from the power amplifier 302. A first transmission line TL31 is connected between node N31 and a second node N32 which is internal to the circuit 300. A second transmission line TL32 is connected between the second node N32 and a third node N33. A first capacitor C31 is connected between second node N32 and a switch SW31 and a second capacitor C32 is connected between third node N33 and switch SW31. The circuit 302 also includes a third capacitor C33 connected between third node N33 and a fourth node N34 which may be an input to the next element or circuit, such as an isolator, in the overall device. Capacitor C33 acts as a DC blocking capacitor, allowing RF signals to pass therethrough.

Switch SW31 is an electronic switch which connects either C31 or C32 to ground at any given instant, depending on a mode input 304. The switch SW31 is typically implemented by a transistor circuit which has two mutually exclusive outputs driven by a mode input 304 from a logic circuit, a processor (not shown), or other such known device. Thus, load switch 300 represents an output matching circuit designed for power efficiency in either the LP or the HP mode, the selected mode being controlled by a mode input signal.

In response to a mode input signal of a first type (e.g., low voltage), capacitor C31 is coupled to ground via switch SW31 and capacitor C32 is unconnected to ground. Transmission lines TL31, TL32 and capacitor C31 operate in conjunction with power amplifier 302 to provide a first predetermined output impedance suitable for 1900 MHz operation.

In response to a mode signal of a second type (e.g., high voltage), capacitor C32 is coupled to ground via switch SW31 and capacitor C31 is unconnected to ground. In such case, the two transmission lines TL31, TL32 and capacitor C32 operate in conjunction with power amplifier 302 to provide a second predetermined output impedance suitable for 800 MHz operation.

The load switching circuit 300 of FIG. 2 is not unlike that disclosed in FIG. 13 of U.S. Pat. No. 5,774,017 to Adar which shows each capacitor C31, C32 connected to a separate switch, the two switches acting in a complementary and mutually exclusive manner.

SUMMARY OF THE INVENTION

The present invention is directed to a power amplifier circuit that includes a power amplifier responsive to a power mode signal, the power amplifier having a power amplifier output node, and a power amplifier load circuit that is also responsive to the power mode signal, the power amplifier load circuit having a load circuit input node connected to the power amplifier output node. The power amplifier and the power amplifier load circuit of the present invention may be implemented as a GaAs integrated circuit.

The power amplifier load circuit may include a first transmission line coupled between the load circuit input node and a first node, a second transmission line coupled between the first node and a second node, a harmonic filter coupled between the load circuit input node and a common node, a first capacitor coupled between the first node and the common node, and a first switch coupled between the common node and ground, wherein the first switch is responsive to the power mode signal. In a first embodiment, the power amplifier load circuit also includes a second capacitor and a second switch connected to one another in series, between the second node and ground, wherein the second switch is responsive to a band select signal. In a second embodiment, the power amplifier load circuit also includes a second capacitor coupled between the second node and the common node. In a third embodiment, the power amplifier load circuit also includes a second capacitor coupled between the second node and ground.

Thus, in one aspect, the power amplifier load circuit may include a first transmission line coupled between the load circuit input node and a first node; a second transmission line coupled between the first node and a second node; a harmonic filter coupled between the load circuit input node and a common node; a first capacitor coupled between the first node and the common node; a first switch coupled between the common node and ground; and a second capacitor and a second switch connected to one another in series between the second node and ground; wherein the first switch is responsive to said power mode signal and the second switch is responsive to a band select signal.

In another aspect, the power amplifier load circuit may include a first transmission line coupled between the load circuit input node and a first node; a second transmission line coupled between the first node and a second node; a harmonic filter coupled between the load circuit input node and a common node; a first capacitor coupled between the first node and the common node; and a second capacitor coupled between the second node and the common node; and a first switch coupled between the common node and ground, wherein the first switch is responsive to said power mode signal.

In yet another aspect, the power amplifier load circuit may include a first transmission line coupled between the load circuit input node and a first node; a second transmission line coupled between the first node and a second node; a harmonic filter coupled between the load circuit input node and a common node; a first capacitor coupled between the first node and the common node; a first switch coupled between the common node and ground; and a second capacitor coupled between the second node and ground. wherein the first switch is responsive to said power mode signal.

In yet another aspect, the power amplifier load circuit may include a first transmission line coupled between the load circuit input node and a first node; a second transmission line coupled between the first node and a second node; a harmonic filter and a first switch connected to one another in series, between the load circuit input node and ground; a first capacitor coupled between the first node and a common node; a second capacitor coupled between the second node and the common node; and a second switch coupled between the common node and ground, wherein the first and second switches are responsive to the power mode signal.

In yet another aspect, the power amplifier load circuit may include a first transmission line coupled between the load circuit input node and a first node; a second transmission line coupled between the first node and a second node, a filter and a first switch connected to one another in series, between the load circuit input node and ground; a first capacitor and a second switch connected to one another in series, between the first node and ground; and a second capacitor and a third switch connected to one another in series, between the second node and ground; wherein the first, second and third switches are all responsive to the power mode signal.

The power mode signal may correspond to one of a low power mode signal and a high power mode signal, the low power mode signal may correspond to a low-power mode of the power amplifier, and the high power mode signal may correspond to a high-power mode of the power amplifier. The low power mode signal, which may have a voltage of approximately 0V, may open the first switch, and the high power mode signal, which may have a voltage of approximately 3V, may close the first switch.

In another preferred aspect of the present invention, the harmonic filter may comprise a filter inductor and a filter capacitor. The filter inductor may have an inductance of approximately 0.75 nH and the filter capacitor may have a capacitance of approximately 14 pF. The first transmission line may have an impedance of approximately 75 ohms.

In yet another aspect, the power amplifier circuit of the present invention may further comprise: a fourth transmission line coupled to the amplifier output node; a second inductor coupled between the fourth transmission line and a battery voltage input node; and a fourth capacitor coupled between the battery voltage input node and ground.

The power amplifier of the present invention may include a phase shift circuit coupled to an power amplifier input node, a first amplifier stage coupled to the phase shift circuit, and a second amplifier stage coupled between the first amplifier stage and the power amplifier output node, wherein the phase shift circuit, the first amplifier stage, and the second amplifier stage are responsive to the power mode signal.

In one embodiment, the phase shift circuit may comprise a second capacitor coupled between the power amplifier input node and a first internal node; an inductor coupled between the first internal node and a second internal node; a third capacitor coupled between the second internal node and the first amplifier stage; a first diode coupled between the first internal node and ground; and a second diode coupled between the second internal node and ground, wherein the power mode signal is input to the first internal node.

In another embodiment, the phase shift circuit may comprise a second capacitor coupled between the power amplifier input node and a first internal node; an inductor coupled between the first internal node and a second internal node; a third capacitor coupled between the second internal node and the first amplifier stage; a fourth capacitor coupled between the first internal node and a third internal node; a fifth capacitor coupled between the second internal node and the third internal node; and a third switch coupled between the third internal node and ground, wherein the third switch is responsive to the power mode signal.

The power amplifier's first amplifier stage may comprise a first transistor having a first transistor base, a first transistor emitter and a first transistor collector; and a first current mirror circuit configured to stabilize a voltage at the first transistor base, while the second amplifier stage may comprise a second transistor having a second transistor base, a second transistor emitter and a second transistor collector; and a second current mirror circuit configured to stabilize a voltage at the second transistor base, wherein the first and second current mirror circuits are responsive to the power mode signal.

The power amplifier's first amplifier stage may further comprise a first input match circuit coupled between the phase shift circuit and the first transistor base; a first output match circuit coupled between the first transistor collector and the second amplifier stage; and an inductor and transmission line connected between a first battery voltage input node and the first transistor collector, and a capacitor connected between said first battery voltage input node and ground, while the second amplifier stage may further comprise a second input match circuit coupled between the first output match circuit and the second transistor base; and an inductor and transmission line connected between a second battery voltage input node and the second transistor collector, and a capacitor connected between said second battery voltage input node and ground.

BRIEF DESCRIPTION OF THE FIGURES

The objects and advantages of the present invention are now described in conjunction with the following figures in which.

DETAILED DESCRIPTION OF THE INVENTION

Figure 1:
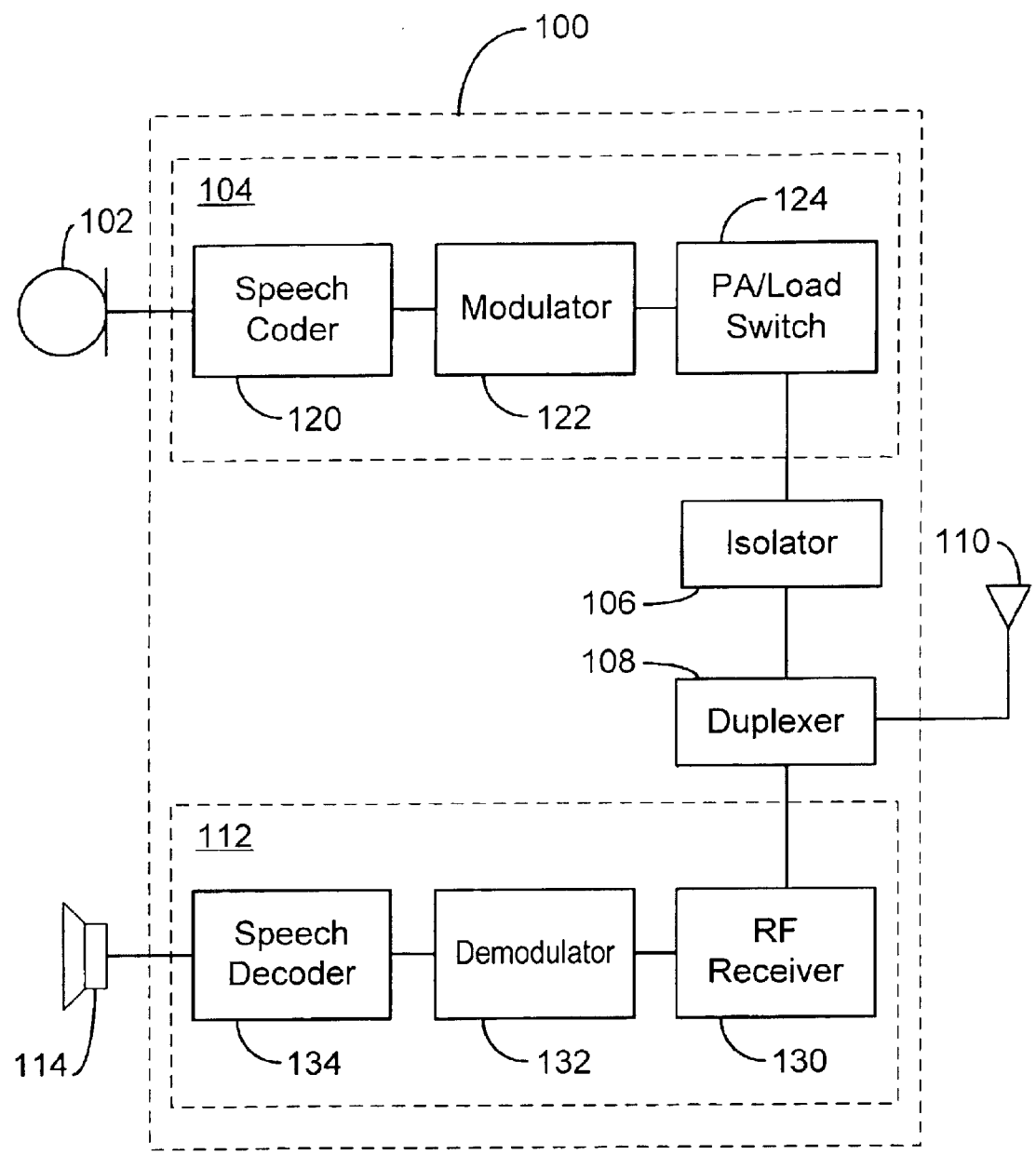
FIG. 1 shows a diagram of a wireless communication system having a power amplifier/load switch circuit.
Figure 2:
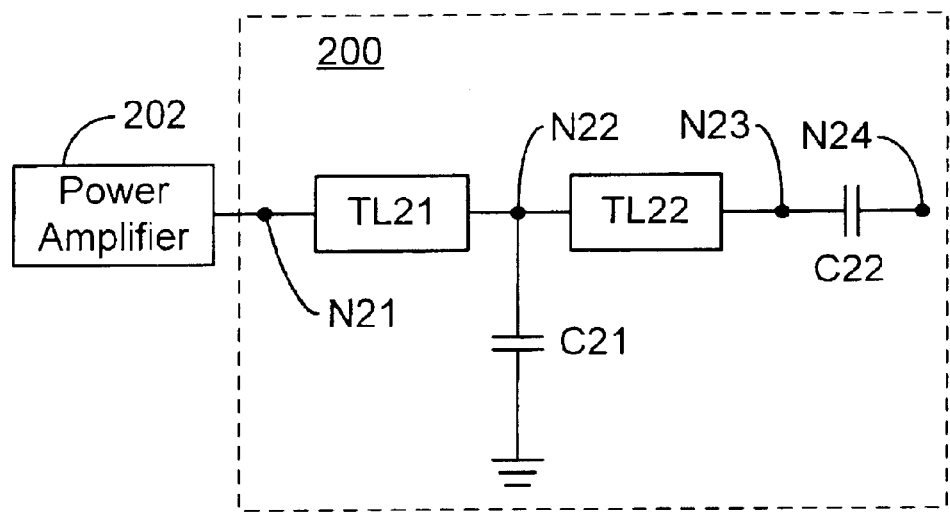
FIG. 2 shows a prior art load circuit.
Figure 3:
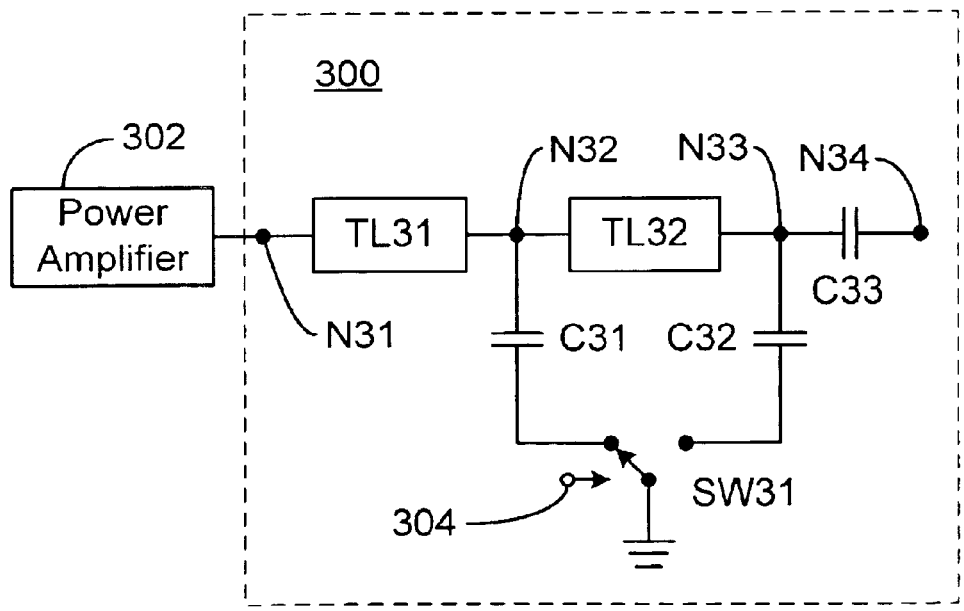
FIG. 3 shows another prior art load switching circuit.
Figure 4:
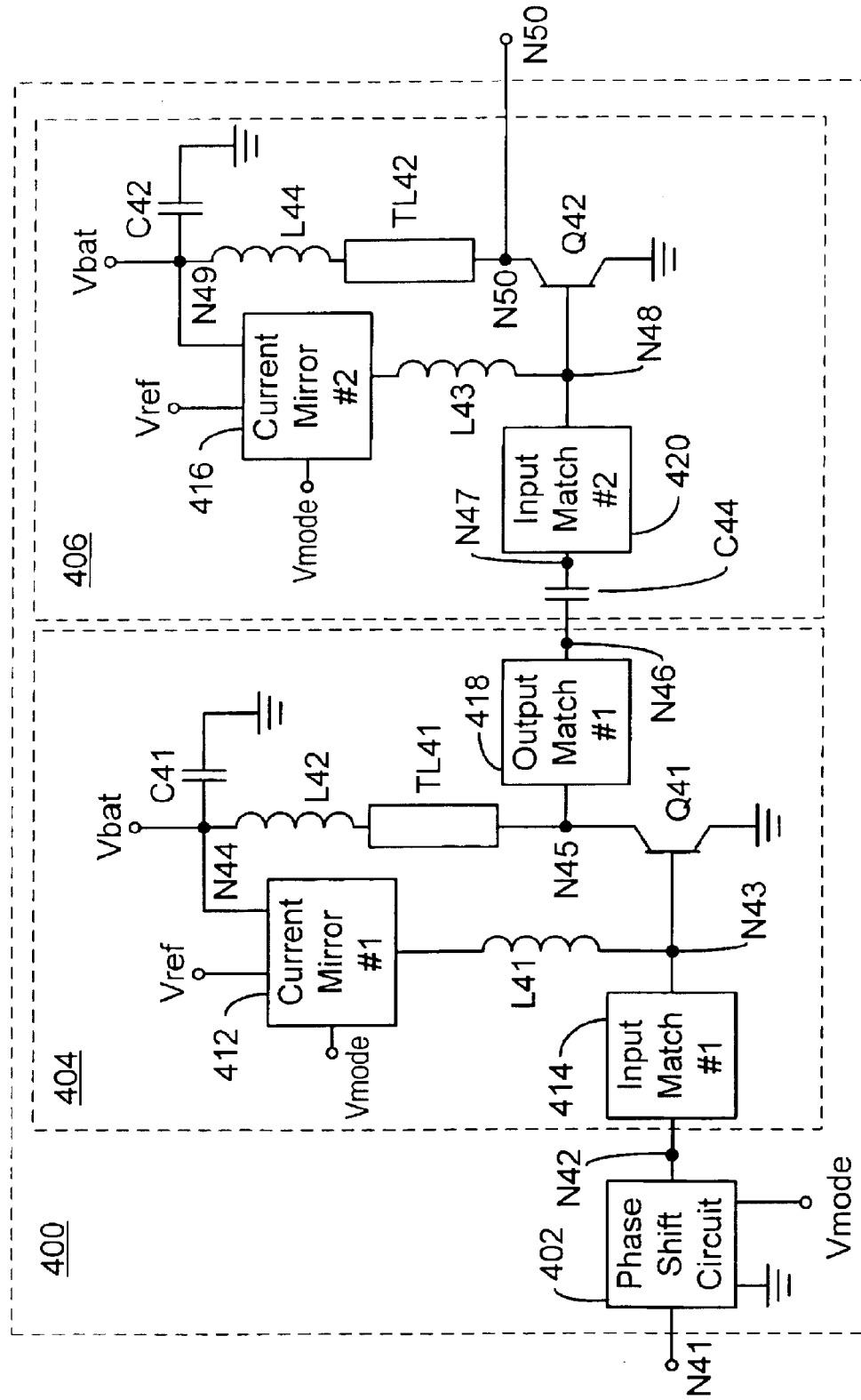
FIG. 4 shows a power amplifier in accordance with the present invention.

FIG. 4 shows a power amplifier 400 in accordance with the present invention. Power amplifier 400 can serve as the power amplifier portion of the power amplifier/load circuit 124 seen in FIG. 1. An RF signal input to power amplifier 400 at input node N41 is subjected to a phase shift circuit 402, a first amplifier stage 404, and a second amplifier stage 406, before exiting at output node N50.

The phase shift circuit 402 helps minimize phase discontinuity when switching between HP and LP modes in order to preserve phase coherency of the output signal. The RF signal entering input node N41 experiences a phase shift that depends on the Vmode signal and is output at node N42, from where it goes on to the first amplifier stage 404.

As is known to those skilled in the art, the Vmode signal is a voltage level controlled by a dictated controller, such as a processor or the like, belonging to the device in which the power amplifier is resident. In the present invention such a controller (not shown) changes the value of the Vmode signal whenever there is change in the mode (low power to high power and vice versa). Thus, when the Vmode signal assumes a first value, the power amplifier is in low power mode and when the Vmode signal assumes a second value different from the first value, the power amplifier is in the high power mode. Without loss of generality, then, the first value may be zero volts and the second value may be 3 volts. It is understood, however that other voltages for each (and also other non-overlapping voltage ranges of each) are also possible. Such a controller may be found, for example, in a MODEM chip (not shown) that includes the modulator 122 and the demodulator 132. The controller may implement a closed-loop power control system and may automatically switch the Vmode signal based on, e.g., whether a high power or low power is needed by the PA.

The first amplifier stage 404 provides an initial amplification of the RF signal. The RF signal exiting the phase shift circuit 402 enters first input matching circuit 414 which adjusts the input impedance from the phase shift circuit 402 to match the impedance expected by the transistor Q41.

Transistor Q41 is preferably a heterojunction bipolar transistor (HBT). First current mirror circuit 412, in conjunction with inductor L41, helps stabilize the voltage at node N43 at the base of transistor Q41 so that the transistor Q41 may operate uniformly over a range of temperatures. The emitter of transistor Q41 is connected to ground while the collector is connected, at node N45, to first output matching circuit 418 which imparts a suitable impedance to the partially amplified RF signal.

A battery voltage Vbat is connected to node N44 from which point it powers the first current mirror circuit 412 and provides a bias to the transistor Q41. More particularly, Vbat is connected to the collector of transistor Q41 via an inductor L42 connected in series with a transmission line TL41. Vbat is also connected to ground via capacitor C41. Inductor L42, transmission line TL41 (which may be implemented by a resistor), and capacitor C41 provide a low pass filter network where only DC bias is passing through while the RF signals are being rejected and do not leak into the power supply.

The partially amplified RF signal exiting first output matching circuit 418 first passes through a DC blocking capacitor C44 situated between nodes N46 and N47. The DC blocking capacitor C44 filters out the DC components of the partially amplified RF signal.

The second amplifier stage further amplifies the RF signal that originally entered the phase shift circuit 402. Second input matching circuit 420 receives the DC-blocked, partially amplified RF signal and ensures that the base lead of transistor Q42 sees the requisite impedance at node N48.

The circuit design of the remainder of the second amplifier stage 406 is substantially the similar to that of the first amplifier stage 404. Thus, second amplifier stage 406 includes second current mirror circuit 416 connected via inductor L43 to node N48 which, in turn, connects to the base lead of transistor Q42. In second amplifier stage 406, Vbat again powers the second current mirror circuit 416 via node N49 and also biases transistor Q42's collector at amplifier output node N50. And just as seen in the first amplifier stage 404, the second amplifier stage 406 includes a low pass filter network formed by inductor L44 in series with transmission line TL42, along with capacitor C42. Thus, much like the first amplifier stage 404, the second current mirror circuit 416 and inductor L43 provide the base with a stabilized voltage. Also, the emitter of transistor Q42 is again grounded while the collector of transistor Q42 is connected to the amplifier output node N50.

The circuit of FIG. 4 functions as follows. When LP mode is needed, the controller (not shown) or other control circuitry causes the Vmode signal to assume a first value, such as a first voltage. When the Vmode signal is held at the first value, it enables the phase shift circuit 402 and controls the current mirror circuits 412, 416 for LP bias. When HP mode is needed, the processor or other control circuitry causes the Vmode signal to assume a second value, such as a second voltage. When the Vmode signal is held at this second value, it disables the phase shift circuit 402 and controls the current mirror circuits 412, 416 for HP bias.

Table 1 shows some of the specifications for the components in FIG. 4. While specific values and descriptions of the components are shown, it is understood that these values may be changed over some range without adversely affecting the performance of the circuit. Furthermore, it is understood that the amplifier may be implemented as an integrated circuit, or even an application-specific integrated circuit (ASIC).

TABLE 1

| Value/Description of Preferred Components in FIG. 4 | |
| --- | --- |
| Component | Value/Description |
| Vref | 3.0 V |
| C41 | 100 pF |
| C42 | 100 pF |
| C44 | 10 pF |
| L41 | 5 nH |
| L42 | 3 nH |
| L43 | 5 nH |
| L44 | 3 nH |
| TL41 | 70 Ω and 20° @ 1 Ghz |
| TL42 | 70 Ω and 20° @ 1 Ghz |
| Q41 | 400 $\mu m^2$ |
| Q42 | 400 $\mu m^2$ |

Figure 5:
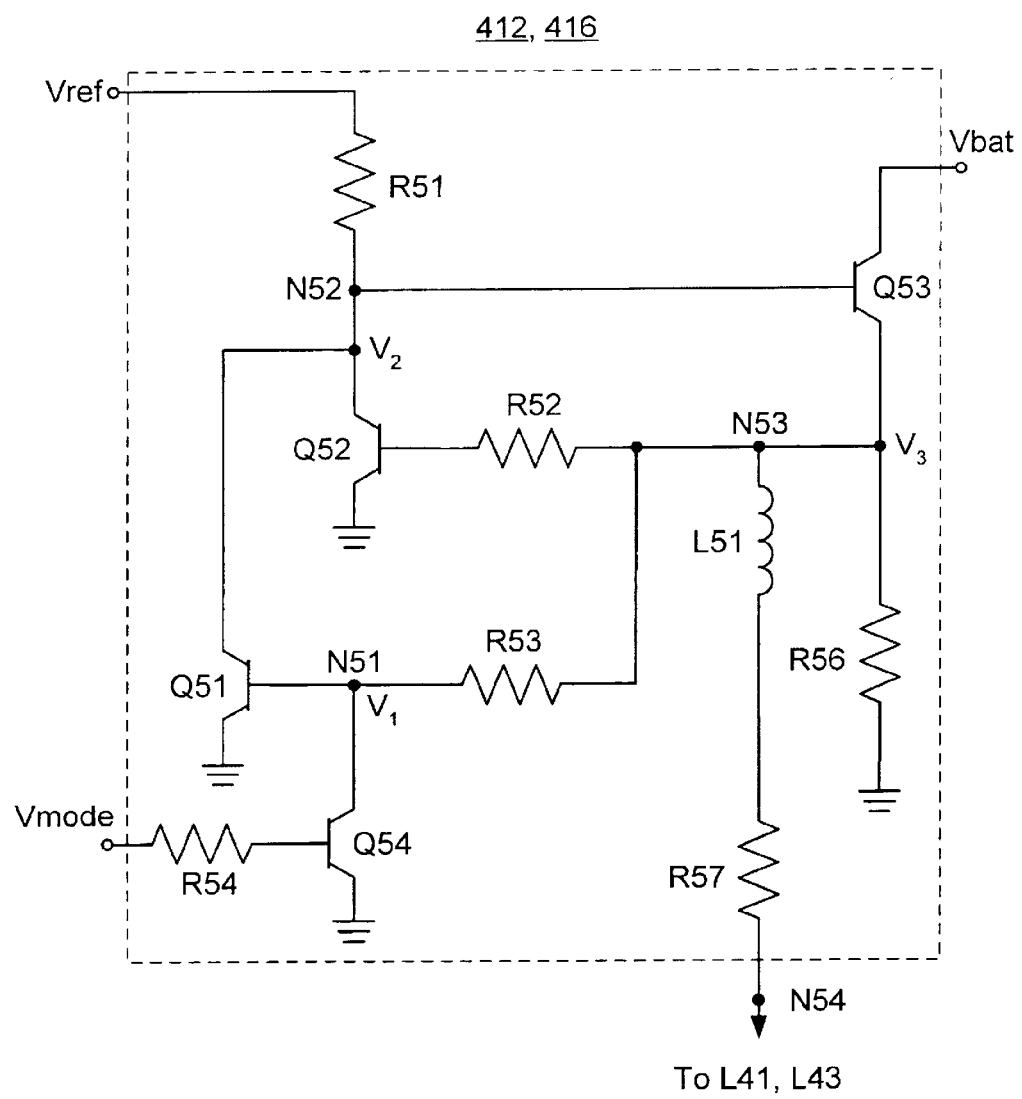
FIG. 5 shows the current mirror circuits of FIG. 4.

FIG. 5 shows a circuit diagram of a preferred embodiment of a current mirror circuit 412, 416 of the sort present in FIG. 4. As previously described, a current mirror circuit helps stabilize the voltage of the transistor base due to temperature variations.

The current mirror circuit 412, 416 has three inputs, Vbat, Vref, and Vmode, and outputs a signal at N54. Vbat provides the battery voltage to the current mirror circuit 412, 416. Vref supplies a reference voltage, and the Vmode signal controls the mode of the current mirror circuit 412, 416. The output of the current mirror circuits 412, 416 are connected to the bases of transistors Q41, Q42, respectively, via inductors L41, L43, respectively.

Each current mirror circuit 412, 416 has three internal nodes designated N51, N52, and N53 and four transistors designated Q51, Q52, Q53, and Q54. The battery voltage Vbat is supplied to the collector of transistor Q53. The base of transistor Q53 is tied to node N52 and its emitter connected to ground via serially connected resistor R56.

Node N53 is also further connected to output node N54 via serially connected inductor L51 and resistor R57. Node N53 is also connected to the base of transistor Q52 via current limiting resistor R52 and to the base of transistor Q51 via resistor R53.

The Vmode signal is applied to the base of transistor Q54 via resistor R54. The emitter of transistor Q54 is connected to ground and its collector is connected to node N51 which has internal voltage V1 and is connected to the base of transistor Q51.

The Vref input is connected to the collector of transistor Q52 via biasing resistor R51. Node 52, which is situated between resistor R51 and the collector of Q52, has internal voltage V2. Node N52 (and thus internal voltage V2) are connected to the base of transistor Q53. Node N52 is also connected to the collector of transistor Q51.

The operation of the current mirror 416 is now described. (The operation of the current mirror 412 is similar.) The principle of the current mirror 416 is the application of a matched base-emitter bias technique—i.e., when the same base-emitter (Vbe) voltage is applied to two matched transistors, and when one branch is set up to source a reference current by the reference transistor, it can be used to "program" the current that will flow in the load transistor. In FIG. 5, V3 represents the common Vbe voltage that is applied to the two reference transistors Q51, Q52 and the load transistor Q42. The reference current, Iref, is the current that flows through R51 and is equal to (Vref–$V_{N52}$)/R51. In the LP mode bias, Vmode assumes a low value. In this case, transistor Q54 is biased off and voltage V3 turns on both transistors Q51 and Q52. In this case, the load current, $I_{Q42}=N_{LP}*Iref$, where $N_{LP}$=(Transistor size of Q42)/(Transistor size of Q51+Q52). In the HP mode, Vmode assumes a high value. In this case, transistor Q54 is biased on and transistor Q51 is turned off. In this case, the load current, $I_{Q42}=N_{HP}*Iref$, where $N_{HP}$=(Transistor size of Q42)/(Transistor size of Q52).

Thus, in the foregoing manner, the current mirror circuit 412, 416 provides temperature stabilization at the base inputs of transistors Q41, Q42 of FIG. 4. Table 2 presents preferred values for the components in the current mirror circuits 412, 416, it again being understood that other component values may also be used.

TABLE 2

Preferred Components in Current Mirrors 412, 416

| Component | Value/Description for Current Mirror 412 | Value/Description for Current Mirror 416 |
|---|---|---|
| Vref | 3.0 V | 3.0 V |
| Q51 | 20 $\mu m^2$ | 40 $\mu m^2$ |
| Q52 | 20 $\mu m^2$ | 40 $\mu m^2$ |
| Q53 | 60 $\mu m^2$ | 120 $\mu m^2$ |
| Q54 | 20 $\mu m^2$ | 20 $\mu m^2$ |
| R51 | 400 Ω | 400 Ω |
| R52 | 1 kΩ | 2 kΩ |
| R53 | 1 kΩ | 2 kΩ |
| R54 | 5 kΩ | 5 kΩ |
| R56 | 2 kΩ | 500 Ω |
| R57 | 50 Ω | 20 Ω |
| L51 | 6 nH | 2 nH |

Figure 6:
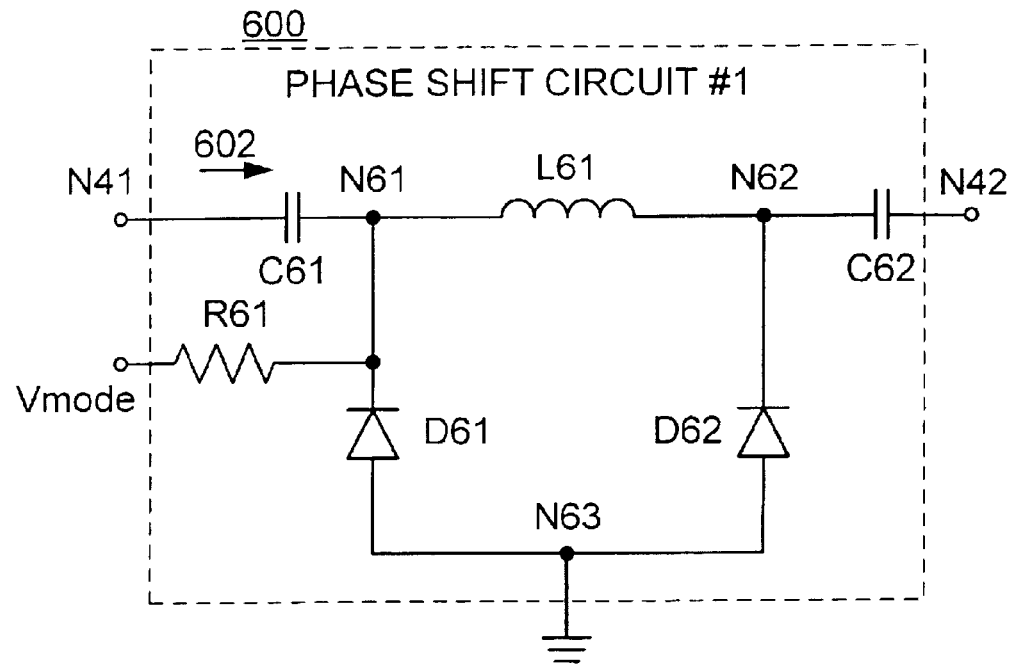
FIGS. 6 and 7 show two embodiments of the phase shift circuit of FIG. 4.
Figure 7:
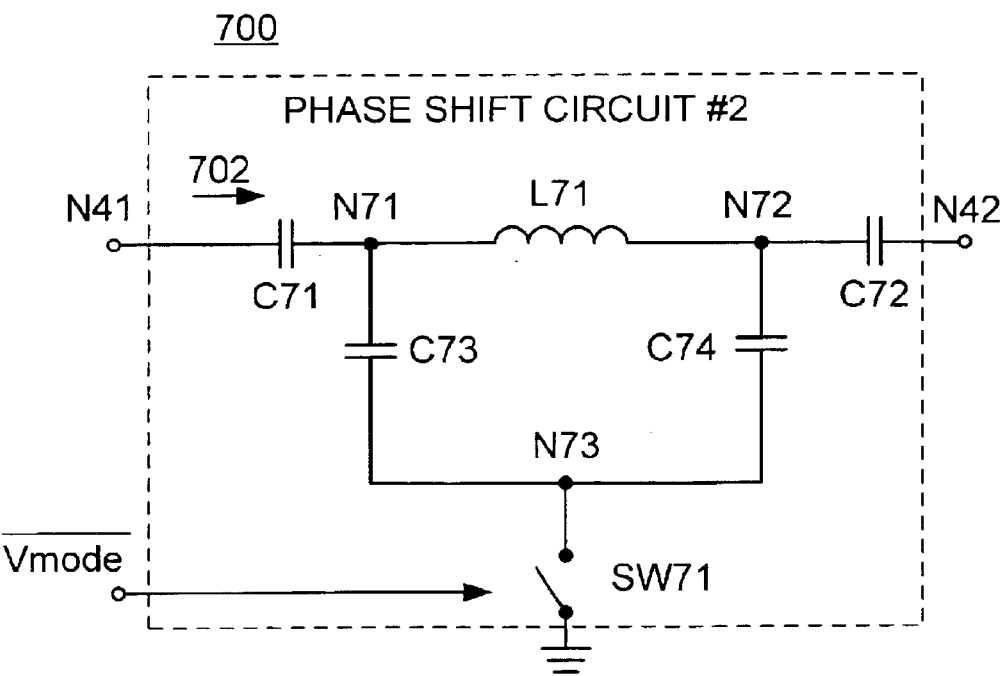

FIGS. 6 and 7 show first 600 and second 700 embodiments of the phase shift circuit 402 seen in FIG. 4. As previously described, the phase shift circuit 402 helps minimize phase discontinuity when the Vmode signal switches between LP and HP modes. The phase shift circuit 402 receives an RF signal input at node N41 and outputs a phase-shifted version of the signal at node N42, with the Vmode signal controlling the behavior of the phase shift circuit 402.

The first phase shift circuit 600 seen in FIG. 6 includes an internal phase shift signal path 602 defined by a first RF blocking capacitor C61 connected in series with an inductor L61 and a second RF blocking capacitor C62 with internal node N61 defined between first capacitor C61 and inductor L61 and internal node N62 defined between inductor L61 and second capacitor C62. The first phase shift circuit 600 also includes a pair of diodes D61 and D62 which have their anodes connected to ground via a common node N63 and their cathodes connected to nodes N61 and N62, respectively. D61 and D62 are biased via a bias resistor R61 from the Vmode control.

The operation of the first phase shift circuit 600 is now described. The first phase shift circuit 600 consists of two shunt variable capacitors C61, C62 that were realized with reversed bias HBT Base-Collector diodes D61, D62 and a series inductor L61. The amount of phase shift is determined by the capacitance values and the inductance values of these three components. In the LP mode, the Vmode may assume a low voltage value (e.g., 0V). This results in a higher capacitance value of the varactor, and therefore more phase shift for the network. In the HP mode, the Vmode assumes a high voltage value (e.g., 3V). This results in a lower capacitance value of the varactor, and therefore less phase shift for the network. This relative phase shift will be used to compensate the differential phase shift resulting from the switched load (discussed below) and consequently achieves phase synchronization for the overall system.

The second phase shift circuit 700, which responds to a $\overline{V mode}$ signal having a high voltage for LP mode and low voltage for HP mode, has an embodiment shown in FIG. 7. It includes an internal phase shift signal path 702 defined by a first capacitor C71 connected in series with an inductor L71 and a second capacitor C72 with internal node N71 defined between first capacitor C71 and inductor L71 and internal node N72 defined between inductor L71 and capacitor C72. The second phase shift circuit 700 also includes a pair of shunt capacitors C73, C74 connected between nodes N71 and N72, respectively, and a common node N73. Common node N73, in turn, is connected to ground via a switch SW71 that is responsive to the $\overline{V mode}$ signal. SW71 is preferably implemented as a transistor switch, in a manner known to those skilled in the art.

The operation of the second phase shift circuit 700 is now described. When the system is in LP mode, $\overline{V mode}$ assumes a high voltage and causes the switch SW71 to be closed. This causes the RF signal to enter the first phase shift signal path (corresponding to a long phase shift path) which consists of the two parallel capacitors C73 and C74 and the series inductor L71. When the system is in HP mode, $\overline{V mode}$ assumes a low voltage and causes the switch SW71 to be opened. This causes the RF signal to enter the second phase shift signal path (corresponding to a short phase shift path) having only inductor L71.

Table 3 presents the values and characteristics of the components in the first 600 and second 700 phase shift circuits which achieve approximately 25° relative phase shift at approximately 850 MHz. The phase shift φ caused by first 600 and second 700 phase shift circuits can be approximately calculated by:

$$\phi = \tan^{-1}\left(\frac{Xn + 2Bn - XnBn^2}{2(1 - XnBn)}\right),$$

where $$Xn = \frac{2\pi fL}{Z_0},$$

$Bn=2\pi fCZ_0$, f=frequency, L=(the inductance of corresponding inductor L61 or L71), C=(the capacitance of capacitors C73, C74 or the depletion capacitance of diodes D61, D62), and $Z_0$=(the characteristic impedance of the source and load).

TABLE 3

Preferred Components in Phase Shift Circuits 600, 700

| Components in Phase Shift Circuit 600 | Value/ Description | Components in Phase Shift Circuit 700 | Value/ Description |
|---|---|---|---|
| C61 | 100 pF | C71 | 100 pF |
| C62 | 100 pF | C72 | 100 pF |
| L61 | 10 nH | L71 | 10 nH |
| D61 | 9600 $\mu m^2$ | C73 | 0.7 pF |
| D62 | 9600 $\mu m^2$ | C74 | 0.7 pF |

Figure 8:
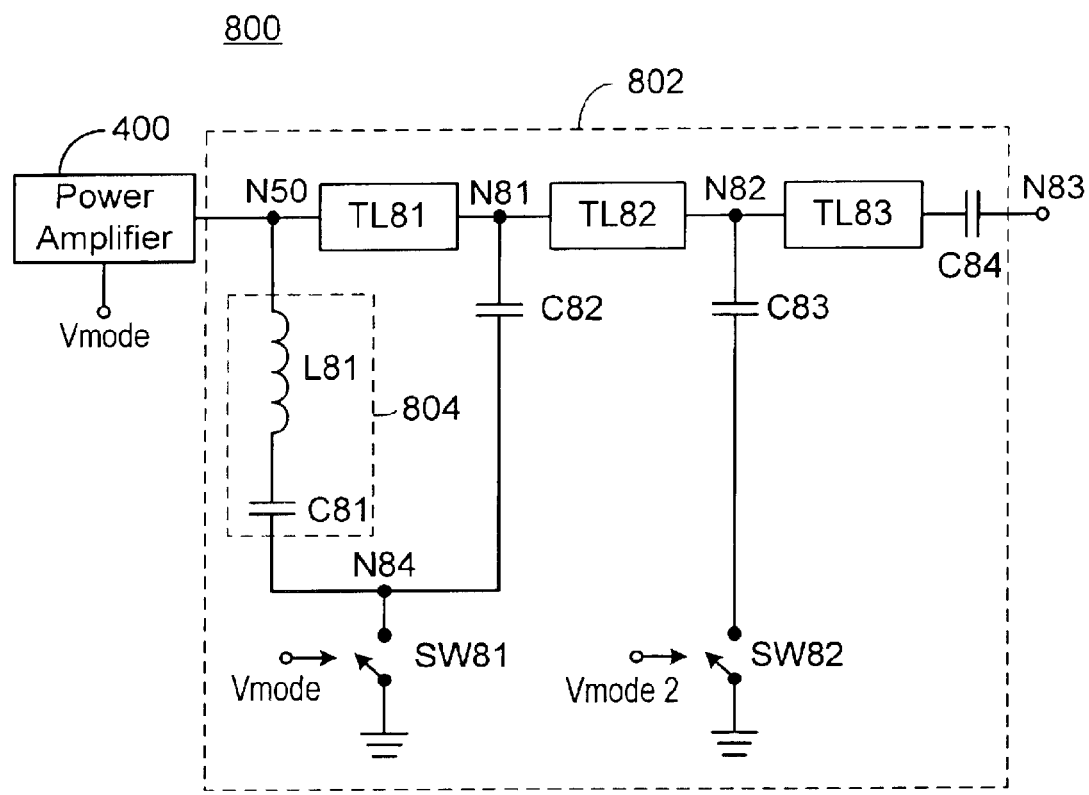
FIG. 8 shows a first embodiment of a combined harmonic trap/impedance load switching circuit in accordance with a first embodiment the present invention.

FIG. 8 shows a combined power amplifier/load switching circuit 800 having a first embodiment of a load switching circuit 802 in accordance with the present invention. In FIG. 8, the output of power amplifier 400 at node N50 is presented to the load switching circuit 802.

Load switching circuit 802 includes a first transmission line TL81 connected between output node N50 and a first internal node N81, a second transmission line TL82 connected between the first internal node N81 and second internal node N82, and a third transmission line TL83 connected between the second internal node N82 and DC blocking capacitor C84. In this manner, the first, second, and third transmission lines TL81, TL82, and TL83, respectively, are serially connected between output node N50 and the DC blocking capacitor C84. After passing through the three transmission lines, an amplified RF signal passes through the DC blocking capacitor before being output at the load switching circuit output node N83.

A harmonic filter 804 (or "harmonic trap") is connected between power amplifier output node N50 and a common node N84. The harmonic filter 804 helps improve signal efficiency. In a typical large signal operation, the amplifier stages 404, 406 generate spectral components at the harmonic frequencies of the input signal. These harmonics generate unwanted interference and need to be suppressed. A harmonic filter 804 is employed on the output circuit of the power amplifier 400 to suppress these unwanted harmonic frequency components. With proper design of this harmonic filter 804, it could also enhance the efficiency performance of the power amplifier 400 due to its ability to shape the output voltage and current waveforms. As seen in FIG. 8, the harmonic filter 804 comprises a filter inductor L81 in series with a filter capacitor C81. Another capacitor C82 is connected between first internal node N81 and common node N84.

The common node N84 is connected to ground via a switch SW81 that is responsive to the Vmode signal. Therefore, capacitor C82 and the harmonic filter 804 are together selectively connected or disconnected to ground in response to the Vmode signal. And while FIG. 8 shows that a single switch SW81 is used to control the harmonic filter and capacitor C82 at common node N84, one skilled in the art will readily recognize that separate switches, each responsive to the Vmode signal, may be used to control each of these to ground, in which case there would be no common node N84.

As also seen in FIG. 8, a second capacitor C83 is connected between the second internal node N82 and ground via a second switch SW82 which is responsive to a Band Select (or Vmode2) signal. Like the Vmode signal, the Band Select signal is also generated by a controller (not shown) associated with the device in which the power amplifier/load switching circuit 800 resides. The Band Select signal controls switch SW82 to selectively connect or disconnect capacitor C83 to ground.

Operation of the load switching circuit 802 is now described. When the device is in the LP mode, switches SW81 and SW82 are both open. In LP mode, with both switches SW81 and SW82 open, the signal at node N50 sees the full impedance presented by transmission lines TL81, TL82, and TL83. As such, a high impedance load (e.g., >20 ohms) is presented to the collector of transistor Q42 of the output device. With a high impedance load, the required current swing to deliver the targeted output power—for a handset PA, this is typically <15 to 20 dBm—will be much less than when a low impedance load is presented. This smaller current swing leads to improved efficiency performance at LP mode.

When the device is in the HP mode, it is necessary that a low impedance load is presented to the collector of transistor Q42 of the output device. This is done by closing switch SW81 to allow the connection of load capacitor C82 to the output transmission line at node N82; furthermore, the closing of the switch SW81 also activates the harmonic filter 804, which is required to suppress the harmonic frequency components and to improve the efficiency performance at high power level.

The switch SW82 is a band select switch. This switch allows the load in the HP mode to be adjusted in a straight-forward manner, thus enabling a dual-band, dual-mode PA operation under an external band select control. In the 800–900 MHz spectrum, there are two major wireless communication standards—CDMA cellular which occupies a frequency band of 824 MHz to 849 MHz, and the GSM band which occupies a frequency band of 880 MHz to 915 MHz. A single 850 MHz PA can be designed to operate in both communication standards with the architecture outline in FIG. 8. For a GSM class 5 PA with an output power of 31.5 dBm, the required load impedance is approximately 3 ohms in a 3V battery system. With switch SW81 closed and switch SW82 open, a value of 75 Ω and 10.5°@1 GHz for transmission line TL81 and 14.2 pF for capacitor C81, the desired load impedance of approximately 3 ohms in the frequency band of 880 to 915 MHz is achieved. For a cellular CDMA PA with an output power of 28.5 dBm, the required output load impedance is also approximately 3 ohms in a 3V battery system. (CDMA PA is a linear power amplifier, typically operating around 4 dB backoff from the saturated output power of the amplifier.) When both switches SW81 and SW82 are closed, and a capacitor C83 of 1.0 pF is inserted into the output load, a load impedance approximately 3 ohms is achieved in the frequency band of 824–849 MHz. Table 4 summaries component values for the 800–900 MHz dual-band PA. The same technique can be also applied to a straight-forward implementation of a dual-band, dual-mode PA for DCS (1710–1785 MHz) and PCS CDMA (1850–1910 MHz) wireless communication standards.

TABLE 4

Preferred components in Load Switching Circuit 802

| Component | Value/Description |
| --- | --- |
| L81 | 0.75 nH |
| C81 | 14 pF |
| C82 | 13.7 pF |
| C83 | 1.5 pF |
| TL81 | 75 Ω and 10.5° @ 1 GHz |
| TL82 | 75 Ω and 1° @ 1 GHz |
| TL83 | 50 Ω |

Figure 9:
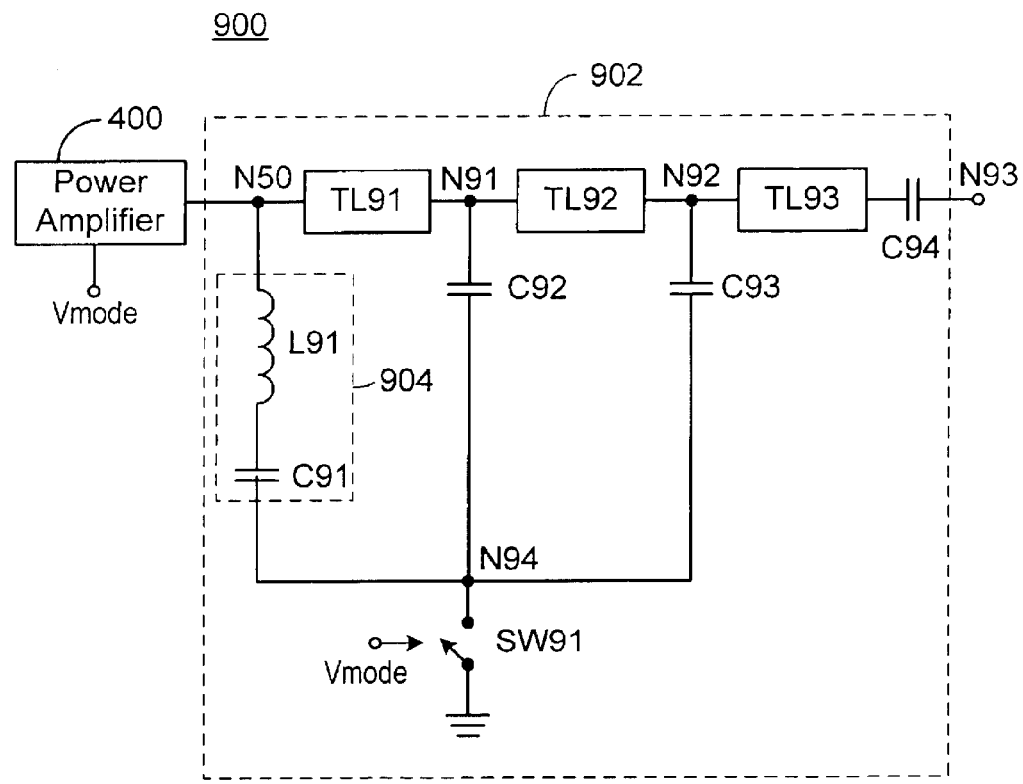
FIG. 9 shows another embodiment of a combined harmonic trap/impedance load switching circuit.

FIG. 9 shows a combined power amplifier/load switching circuit 900 having a second embodiment of a load switching circuit 902 in accordance with the present invention.

Much of the design of load switching circuit 902 is similar to that of load switching circuit 802. Thus, load switching circuit 902 includes serially connected transmission lines TL91, TL92, TL93 with first N91 and second N92 nodes established between adjacent pairs of the transmission lines, and blocking capacitor C94 connected between transmission line TL93 and output node N93. Load switching circuit 902 also includes a harmonic filter 904 comprising filter inductor L91 and filter capacitor C91 connected in series between power amplifier output node N50 and common node N94. Like load switching circuit 802, load switching circuit 902 further has first capacitor C92 connected between the first internal node N91 and common node N94. Furthermore, the common node N94 is connected to ground via a switch SW91 that is responsive to the Vmode signal.

In load switching circuit 902, however, a second capacitor C93 is connected between the second internal node N92 and the common node N94, and so C93 is not selectively connected to ground by a signal other than the Vmode signal. Therefore, in this embodiment, the harmonic filter 904, the first capacitor C92, and second capacitor C93 are all selectively connected or disconnected to ground in response to the Vmode signal.

As compared to load switching circuit 802, the switched load capacitor C82 is now split into two—capacitors C92 and C93. The combined circuit of transmission lines TL91, TL92 and capacitors C92, C93 forms a two-section impedance transformation circuit which broadens the frequency bandwidth of the HP load design over the single-section impedance transformation network, leading to a design that is less sensitive to component variations in the manufacturing. Table 5 presents preferred component characteristics for load switching circuit 902.

TABLE 5

Preferred components in Load Switching Circuit 902

| Component | Value/Description |
|---|---|
| L91 | 0.75 nH |
| C91 | 14 pF |
| C92 | 10 pF |
| C93 | 8 pF |
| TL91 | 75 Ω and 7.5° @ 1 GHz |
| TL92 | 75 Ω and 6.0° @ 1 GHz |
| TL93 | 50 Ω° |

In the embodiment of FIG. 9, a single switch SW91 is used to control the harmonic filter 904, first capacitor C92, and second capacitor C93. However, one skilled in the art will readily recognize that more than one switch may be used to simultaneously connect or disconnect harmonic filter 904 and capacitors C92 and C93 to ground, in response to the Vmode signal.

Figure 11:
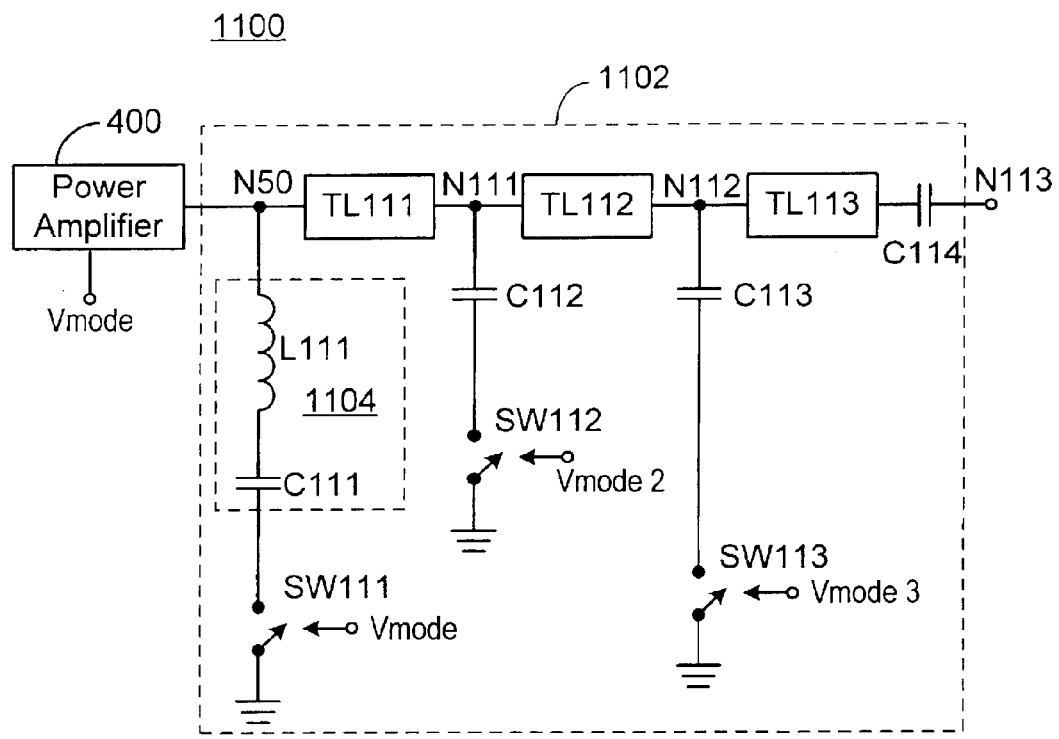
FIG. 11 shows another embodiment of a combined harmonic trap/impedance load switching circuit.

In a first variation, one may employ three separate switches, each responsive to the Vmode signal. In this first variation, the three switches selectively and individually connect each of harmonic filter 904, second capacitor C92, and third capacitor C93 to ground (in which case there would be no common node shared by the three elements). FIG. 11 shows such a combined power amplifier/load switching circuit having three switches. In FIG. 11, harmonic filter 1104 is connected between N50 and ground through switch SW111, capacitor C112 is connected between N111 and ground through switch SW112, and capacitor C113 is connected between N112 and ground through switch SW113. In FIG. 11, the control signals for controlling switches SW111, SW112, SW113 are designated Vmode1, Vmode2, and Vmode3, respectively, to indicate that each switch may be operated in different configurations as needed. For example, if the same signal is applied to all three switches, the configuration becomes functionally equivalent to the circuit shown in FIG. 9. Similarly, if Vmode1=Vmode2, the configuration shown in FIG. 11 becomes functionally equivalent to the circuit shown in FIG. 8 when Vmode3 is a band select signal.

Figure 12:
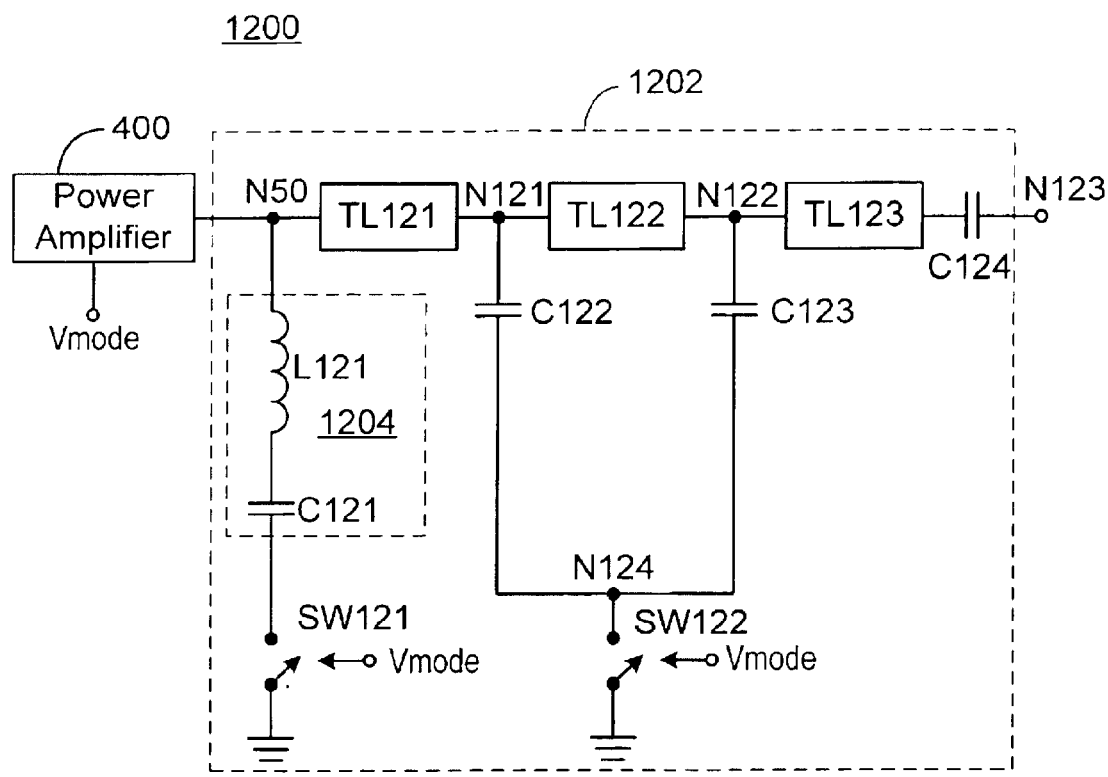
FIG. 12 shows another embodiment of a combined harmonic trap/impedance load switching circuit.

In a second variation, one may employ two switches, both of which are responsive to Vmode. In this second variation, capacitors C92 and C93 are connected between the first N91 and second N92 internal nodes, respectively, to a common node. A first switch connects only the harmonic filter 904 to ground and a second switch connects the common node to ground. Since the capacitors are lossy components which degrade the efficiency performance of the HP mode, this second variation in which a single switch connects both capacitors C92 and C93 to ground has the benefit of reducing the loss effect of the capacitors, thus preserving the HP efficiency performance. FIG. 12 shows such a combined power amplifier/load switching circuit having two switches, both responsive to the Vmode signal. In FIG. 12, harmonic filter 1204 is connected between node N50 and ground through switch SW121. Capacitor 122 is connected between node N121 and common node N124. Capacitor 123 is connected between node N122 and common node N124. Common node N124 is connected to ground through switch SW122. Both SW121 and SW122 are responsive to the Vmode signal.

Figure 10:
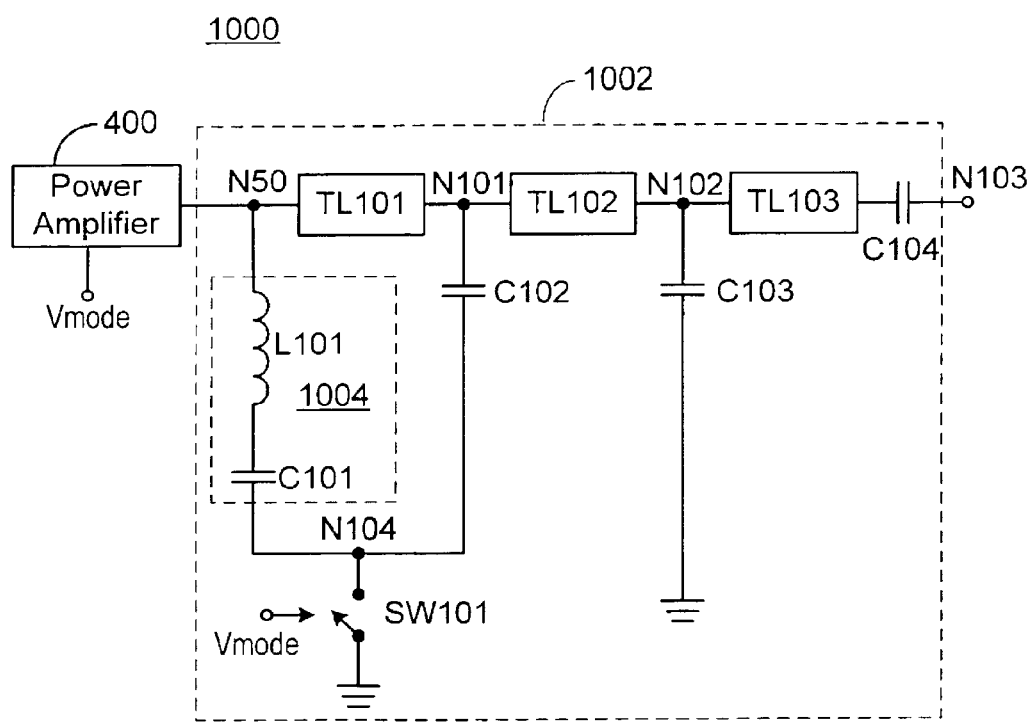
FIG. 10 shows another embodiment of a combined harmonic trap/impedance load switching circuit.

FIG. 10 shows a combined power amplifier/load switching circuit 1000 having a third embodiment of a load switching circuit 1002 in accordance with the present invention. Again, much of the design of load switching circuit 1002 is similar to that of load switching circuit 802. Thus, circuit 1002 includes serially connected transmission lines TL11, TL102, TL103 with first N101 and second N102 nodes established between adjacent pairs of the transmission lines, and blocking capacitor C104 connected between transmission line TL103 and output node N103. Load switching circuit 1002 also includes a harmonic filter 1004 comprising filter inductor L101 and filter capacitor C101 connected in series between power amplifier output node N50 and common node N104. Like load switching circuit 802, load switching circuit 1002 further has a first capacitor C102 connected between the first internal node N101 and common node N104. Furthermore, the common node N104 is connected to ground via a switch SW10 that is responsive to the Vmode signal.

In load switching circuit 1002, however, the second capacitor C103 is permanently connected between the second internal node N102 and ground and so, unlike in load switching circuits 802 and 902, is not selectively connectable to ground and its connectivity is not impacted by either the Vmode signal of a Band Select signal.

As compared to load switching circuit 902, load switching circuit 1002 improves power efficiency in HP mode at the expense of the power efficiency in LP mode. This is because, in this case, there is no switch connected to capacitor C103, thus reducing the loss contribution in the HP mode; however, with capacitor C103 permanently connected to ground, the LP mode load impedance is now limited to a lower value. The design of load switching circuit 902 (of FIG. 9) is therefore best suited for a PA design where both HP and LP mode efficiencies need to be considered. Table 6 presents preferred component characteristics for load switching circuit 1002.

TABLE 6

Preferred components in Load Switching Circuit 1002

| Component | Value/Description |
|---|---|
| L101 | 0.75 nH |
| C101 | 14 pF |
| C102 | 12 pF |
| C103 | 4 pF |
| TL101 | 75 Ω and 10.0° @ 1 GHz |
| TL102 | 75 Ω and 2.0° @ 1 GHz |
| TL103 | 50 Ω° |

The power amplifier and load switching circuits preferably are implemented as a GaAs integrated circuit. As is known to those skilled in the art, this can provide certain power and speed advantages.

While the above invention has been described and illustrated herein with respect to certain preferred embodiments, it should be apparent that various alternatives, modifications, adaptations, and variations will be apparent to those skilled in the art and may be made utilizing the teachings of the present disclosure without departing from the scope of the invention and are intended to be within the scope of the invention as defined by the claims herein.

What is claimed is:

1. A power amplifier circuit comprising:
   a power amplifier responsive to a power mode signal, said power amplifier having a power amplifier output node; and
   a power amplifier load circuit also responsive to said power mode signal, said power amplifier load circuit having a load circuit input node connected to said power amplifier output node;
   wherein the power amplifier load circuit comprises:
      a first transmission line coupled between the load circuit input node and a first node;
      a second transmission line coupled between the first node and a second node;
      a harmonic filter coupled between the load circuit input node and a common node;
      a first capacitor coupled between the first node and the common node; and
      a first switch coupled between the common node and ground,
   wherein the first switch is responsive to said power mode signal.

2. The power amplifier circuit according to claim 1, wherein the power amplifier load circuit further comprises:
   a second capacitor and a second switch connected to one another in series, between the second node and ground, wherein the second switch is responsive to a band select signal.

3. The power amplifier circuit according to claim 1, wherein the power amplifier load circuit further comprises:
   a second capacitor coupled between the second node and the common node.

4. The power amplifier circuit according to claim 1, wherein the power amplifier load circuit further comprises:
   a second capacitor coupled between the second node and ground.

5. The power amplifier circuit according to any one of claims 2, 3, and 4, wherein the power amplifier load circuit further comprises a third transmission line connected between the second node and a load circuit output node.

6. The power amplifier circuit according to claim 1, wherein the power amplifier load circuit further comprises:
   a fourth transmission line coupled to the amplifier output node;
   an inductor coupled between the fourth transmission line and a battery voltage input node; and
   a capacitor coupled between the battery voltage input node and ground.

7. The power amplifier circuit according to claim 1, wherein the power amplifier an the power amplifier load circuit are implement as a GaAs integrated circuit.

8. The power amplifier circuit according to claim 1, wherein the power mode signal corresponds to one of a low power mode signal and a high power mode signal, wherein the low power mode signal corresponds to a low-power mode of the power amplifier and the high power mode signal corresponds to a high-power mode of the power amplifier.

9. The power amplifier circuit according to claim 8, wherein the low power mode signal has a voltage of approximately 0V and the high power mode signal has voltage of approximately 3V.

10. The power amplifier circuit according to claim 1, wherein the harmonic filter comprises a filter inductor and a filter capacitor connected in series.

11. The power amplifier circuit according to claim 10, wherein the filter inductor has an inductance of approximately 0.75 nH and the filter capacitor has a capacitance of approximately 14 pF.

12. The power amplifier circuit according to claim 1, wherein the power amplifier comprises:
   a phase shift circuit coupled to a power amplifier input node;
   a first amplifier stage coupled to the phase shift circuit; and
   a second a amplifier stage coupled between the first amplifier stage and the power amplifier output node,
   wherein the phase shift circuit, the first amplifier stage, and the second amplifier stage are responsive to the power mode signal.

13. The power amplifier circuit according to claim 12, wherein the phase shift circuit comprises:
   a second capacitor coupled between the power amplifier input node and a first internal node;
   an inductor coupled between the first internal node and a second internal node;
   a third capacitor coupled between the second internal node and the first amplifier stage;
   a first diode coupled between the first internal node and ground; and
   a second diode coupled between the second internal node and ground,
   wherein the power mode signal is input to the first internal node.

14. The power amplifier circuit according to claim 12, wherein the phase shift circuit comprises:
   a second capacitor coupled between the power amplifier input node and a first internal node;
   an inductor coupled between the first internal node and a second internal node;
   a third capacitor coupled between the second internal node and the first amplifier stage;
   a fourth capacitor coupled between the first internal node and a third internal node;
   a fifth capacitor coupled between the second internal node and the third internal node; and
   a third switch coupled between the third internal node and ground,
   wherein the third switch is responsive to the power mode signal.

15. The power amplifier circuit according to claim 12, wherein the phase shift circuit is tunable.

16. The power amplifier circuit according to claim 12, wherein:
   the first amplifier stage comprises:
      a first transistor, having a first transistor base, a first transistor emitter and a first transistor collector; and
      a first current mirror circuit configured to stabilize a voltage at the first transistor base, and
   the second amplifier stage comprises:
      a second transistor, having a second transistor base, a second transistor emitter and a second transistor collector; and
      a second current mirror circuit configured to stabilize a voltage at the second transistor base, and
   the first and second current mirror circuits are responsive to the power mode signal.

17. The power amplifier circuit according to claim 16, wherein:

the first amplifier stage further comprises:
a first input match circuit coupled between the phase shift circuit and the first transistor base;
a first output match circuit coupled between the first transistor collector and the second amplifier stage; and
an inductor and transmission line connected between a first battery voltage input node and the first transistor collector, and a capacitor connected between said first battery voltage input node and ground, the second amplifier stage further comprises:
a second input match circuit coupled between the first output match circuit and the second transistor base; and
an inductor and transmission line connected between a second battery voltage input node and the second transistor collector, and a capacitor connected between said second battery voltage input node and ground.

18. A power amplifier circuit, comprising:

a power amplifier responsive to a power mode signal, said power amplifier having a power amplifier output node; and a power amplifier load circuit also responsive to said power mode signal, said power amplifier load circuit having a load circuit input node connected to said power amplifier output node;

wherein the power amplifier load circuit comprises:
a first transmission line coupled between the load circuit input node and a first node;
a second transmission line coupled between the first node and a second node;
a harmonic filter and a first switch connected to one another in series, between the load circuit input node and ground;
a first capacitor coupled between the first node and a common node;
a second capacitor coupled between the second node and the common node; and
a second switch coupled between the common node and ground, wherein the first and second switches are responsive to the power mode signal.

19. A power amplifier circuit, comprising:

a power amplifier responsive to a power mode signal, said power amplifier having a power amplifier output node; and a power amplifier load circuit also responsive to said power mode signal, said power amplifier load circuit having a load circuit input node connected to said power amplifier output node;

wherein the power amplifier load circuit comprises:
a first transmission line coupled between the load circuit input node and a first node;
a second transmission line coupled between the first node and a second node,
a filter and a first switch connected to one another in series, between the load circuit input node and ground;
a first capacitor and a second switch connected to one another in series, between the first node and ground; and
a second capacitor and a third switch connected to one another in series, between the second node and ground;

wherein the first, second and third switches are all responsive to the power mode signal.

* * * * *

UNITED STATES PATENT AND TRADEMARK OFFICE
CERTIFICATE OF CORRECTION

PATENT NO. : 6,806,767 B2
DATED : October 19, 2004
INVENTOR(S) : Dow

It is certified that error appears in the above-identified patent and that said Letters Patent is hereby corrected as shown below:

Column 17,
Line 53, replace "an" with -- and --; and
Line 54, replace "implement" with -- implemented --.

Signed and Sealed this

Twenty-second Day of February, 2005

JON W. DUDAS
*Director of the United States Patent and Trademark Office*